United States Patent
Tsai et al.

(10) Patent No.: US 8,593,324 B2
(45) Date of Patent: Nov. 26, 2013

(54) ANALOG-TO-DIGITAL CONVERTING CIRCUIT AND ANALOG-TO-DIGITAL CONVERTING METHOD

(75) Inventors: Chun-An Tsai, Hsinchu County (TW); Chi-Chun Liao, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 81 days.

(21) Appl. No.: 13/466,146

(22) Filed: May 8, 2012

(65) Prior Publication Data

US 2013/0181855 A1 Jul. 18, 2013

(30) Foreign Application Priority Data

Jan. 16, 2012 (TW) .............................. 101101572 A

(51) Int. Cl.
*H03M 1/12* (2006.01)
(52) U.S. Cl.
USPC ............................. 341/155; 341/118; 348/695
(58) Field of Classification Search
USPC .......... 341/118, 155; 348/257, 572, 573, 607, 348/678, 689, 691, 695, 696
See application file for complete search history.

(56) References Cited

U.S. PATENT DOCUMENTS

| | | | | |
|---|---|---|---|---|
| 5,146,223 A | * | 9/1992 | Muto | 341/118 |
| 5,371,552 A | * | 12/1994 | Brummette et al. | 348/697 |
| 7,116,261 B1 | * | 10/2006 | Li et al. | 341/155 |
| 7,916,062 B2 | * | 3/2011 | Tsai et al. | 341/155 |
| 2002/0172112 A1 | * | 11/2002 | Shoji et al. | 369/47.35 |

* cited by examiner

*Primary Examiner* — Howard Williams
(74) *Attorney, Agent, or Firm* — Jianq Chyun IP Office

(57) ABSTRACT

An analog-to-digital converting circuit includes a reference circuit and an analog-to-digital converter (ADC). The reference circuit provides a base voltage, which has one end grounded. The ADC receives an analog input signal and a base voltage signal. The ADC includes a first DC buffer and an ADC core unit. The first DC buffer internally receives an offset voltage signal and a data voltage signal to be digitized, and outputs two converting control signals. The ADC core unit receives the two converting control signals from the first DC buffer and an ADC input range voltage signal, and outputs a digital code. All of the offset voltage signal and the data voltage signal and the ADC input range voltage signal have been added with the base voltage signal.

7 Claims, 2 Drawing Sheets

ANALOG-TO-DIGITAL CONVERTING CIRCUIT AND ANALOG-TO-DIGITAL CONVERTING METHOD

CROSS-REFERENCE TO RELATED APPLICATION

This application claims the priority benefit of Taiwan application serial no. 101101572, filed on Jan. 16, 2012. The entirety of the above-mentioned patent application is hereby incorporated by reference herein and made a part of this specification.

BACKGROUND OF THE INVENTION

1. Technical Field

The invention relates to an analog-to-digital converting technique, which may reduce conversion errors resulting from variations of process, voltage, temperature, or noise.

2. Description of Related Art

Information in digital format is common nowadays, which is convenient for information storing or processing. For example, a video electronic device needs to convert an analog signal to a digital signal for subsequent processing. Therefore, an analog-to-digital converting circuit is an essential circuit in a digitalizing electronic device.

Nevertheless, as a video analog-to-digital converter (ADC) is easily affected by variations of process (P), voltage (V), temperature (T) and noise, a discrepancy or error may occur in an ADC output code.

FIG. 1 is a schematic block drawing illustrating a conventional analog-to-digital converting circuit. With reference to FIG. 1, in terms of operation mechanism of an analog-to-digital converting circuit, a reference circuit 50 is needed to generate a required "working voltage" and "working current" to each of ADC 100, three for example, which are numbered as ADC1-ADC3.

In each of the ADC 100, a gain block 102 generates a required ADC input range voltage signal 104 to an ADC core unit 118, so as to control the range to be digitalized.

Each of the ADC 100 also includes an offset block 108, which connects to the gain block 102 to receive another voltage signal 106 outputted from the gain block 102, and generates an offset voltage signal, which is represented by ADC_VIM; the offset voltage signal is regulated by an external regulator 110, and a voltage value after regulation is represented by Voffset Each of the ADC 100 also includes a clamp voltage block 112. An output generated by the gain block 102 to the offset block 108 is also inputted to the clamp voltage block 112, so as to generate a clamp voltage signal required for clamping. A multiplexer (MUX) 114 receives the clamp voltage signal and a ground voltage and outputs a clamp voltage Vclamp, which is also regulated by an external capacitor 120.

Each of the ADC 100 also receives an inputted analog voltage signal Vin, which is inputted to the internal through an external capacitor 122. Also, through a switch 124, the clamp voltage Vclamp outputted from the MUX 114 adds a DC level to each input signal, and a data voltage signal is thus generated, which is represented by ADC_VIP.

Each of the ADC 100 also includes a DC buffer 116, which receives the data voltage signal ADC_VIP and the offset voltage signal ADC_VIM. The voltage signals of ADC_VIP and ADC_VIM, after being inputted to the DC buffer 116, are outputted to the ADC core unit 118 through the DC buffer 116, and through the algorithm thereof, different sizes of analog voltage signal Vin are generated, and converted digital codes are outputted. As such, the analog voltage signal Vin may be a gray level signal in an RGB (red, green, blue) color system or a color signal in a YPbPr system.

In the above-mentioned ADC 100, the working voltage or working current generated by the reference circuit may be affected by variations of process, voltage, temperature and noise. Moreover, the voltage signals of ADC_VIP and ADC_VIM, and the ADC input range voltage signal may also vary. If the differences among these signals are not consistent, incorrect digital codes may be generated.

Further researches are necessary for improving the correctness of the digital code outputted from the ADC 100.

SUMMARY

The invention provides an analog-to-digital converting circuit and a method thereof, which may reduce conversion errors resulting from variations of process, voltage, temperature, or noise.

The invention provides an analog-to-digital converting circuit, which includes a reference circuit and an analog-to-digital converter (ADC). The reference circuit provides a base voltage, which has one end grounded. The ADC receives an analog input signal and the base voltage signal. The ADC includes a first DC buffer and an ADC core unit. The first DC buffer internally receives an offset voltage signal and a data voltage signal to be digitized, and outputs two converting control signals. The ADC core unit receives the two converting control signals from the first DC buffer and an ADC input range voltage signal, and outputs a digital code. All of the offset voltage signal and the data voltage signal and the ADC input range voltage signal have been added with the base voltage signal.

The invention provides an analog-to-digital converting method, which includes using a reference circuit to provide a base voltage, wherein the base voltage signal has one end grounded. The method also includes outputting the base voltage signal to an ADC, such that a DC buffer in the ADC and a plurality of control voltage signals of an ADC core unit reference the base voltage and output a converting digital code.

In order to make the aforementioned and other objects, features and advantages of the disclosure comprehensible, embodiments accompanied with figures are described in detail below.

DETAILED DESCRIPTION OF DISCLOSED EMBODIMENTS

The invention provides an analog-to-digital converting circuit and a method thereof, which may reduce conversion errors resulting from variations of process, voltage, temperature, or noise.

The invention will be further explained referring to the following embodiments. However, it is understood that the invention is not limited to the embodiments described herein.

Figure 1:
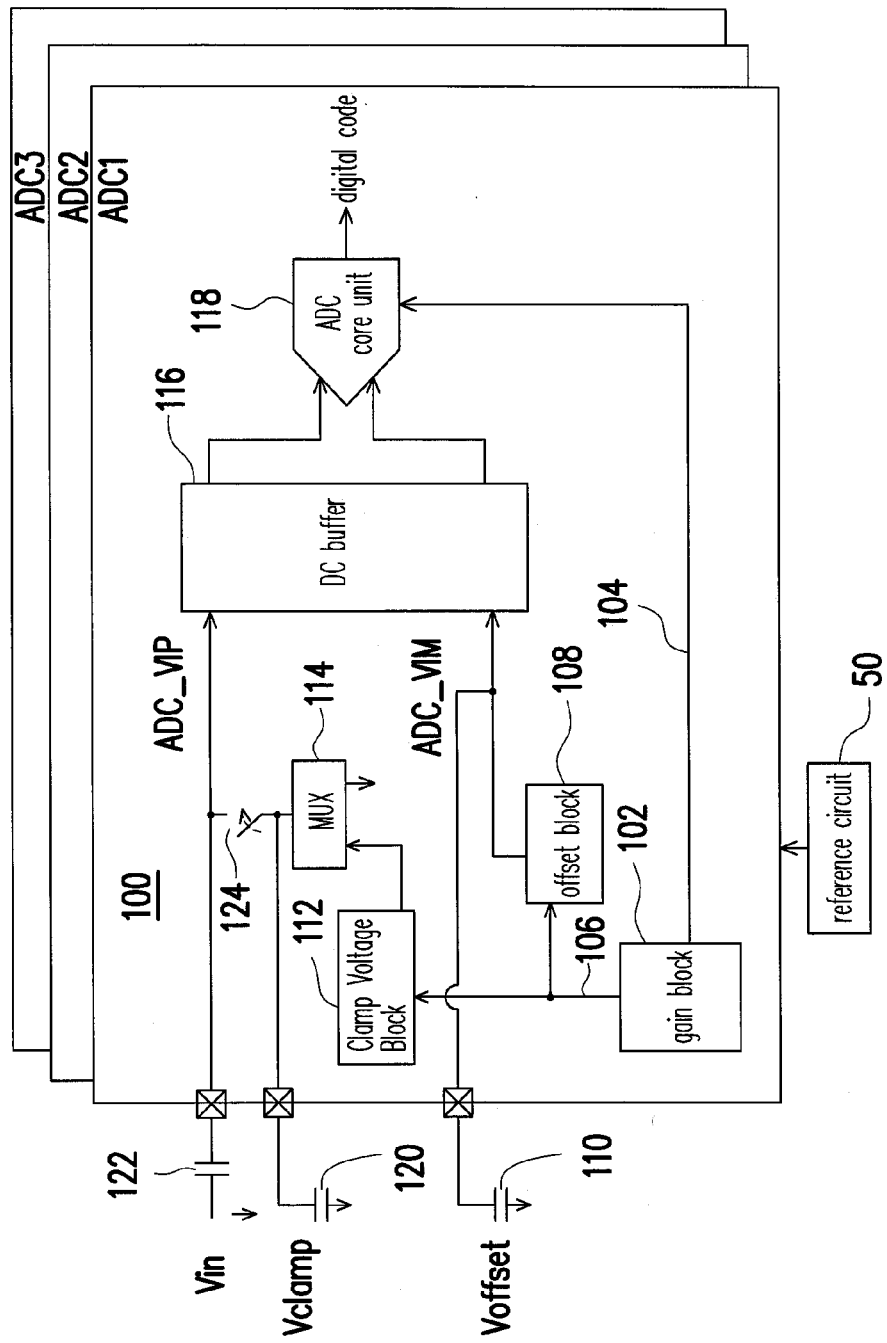
FIG. 1 is a schematic block drawing illustrating a conventional analog-to-digital converting circuit.
Figure 2:
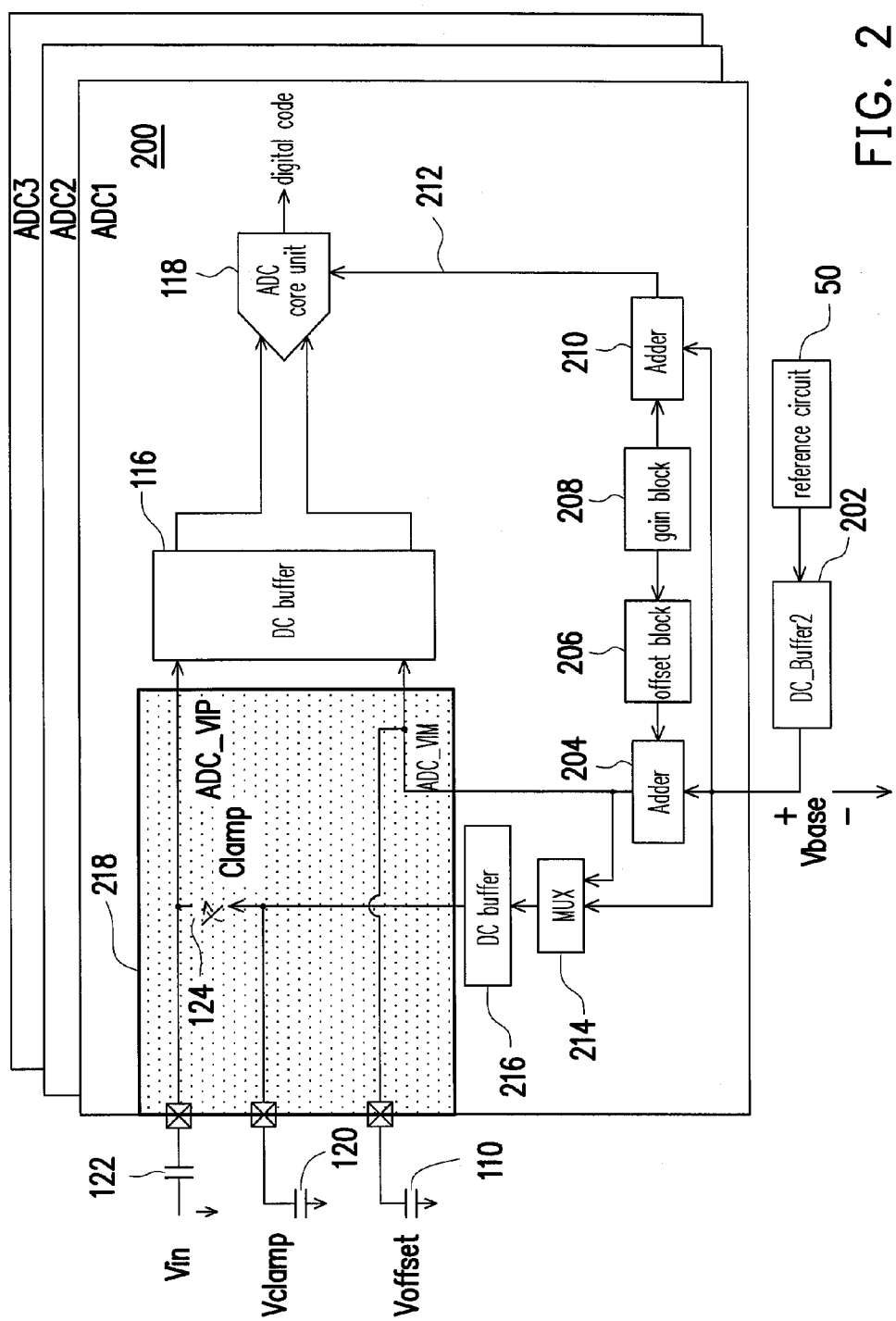
FIG. 2 is a schematic drawing illustrating an analog-to-digital converting circuit according to an embodiment of the invention.

FIG. 2 is a schematic drawing illustrating an analog-to-digital converting circuit according to an embodiment of the invention. With reference to FIG. 2, a reference circuit 50 generates a required working voltage, working current, and a base voltage Vbase to each of analog-to-digital converters (ADC) 200, such as three ADCs numbered as ADC1-ADC3. The base voltage Vbase generated by the reference circuit 50 has one end grounded. Furthermore, the base voltage Vbase may be inputted through a DC buffer 202. That is, the base voltage Vbase contains variations of the reference circuit 50 due to various factors.

In each of the ADC 200, a gain block 208 generates two voltage signals as required, wherein one output voltage signal is used for thereafter generating an offset voltage signal ADC_VIM and a data voltage signal ADC_VIP, and the other output voltage signal is used for thereafter generating an ADC input range voltage signal 212. All of the offset voltage signal ADC_VIM, the data voltage signal ADC_VIP, and the ADC input range voltage signal 212 will be added with the base voltage Vbase. As a result, variations of P, V, T or power supply noise may have a relatively consistent impact on the ADC 200 and on the reference circuit 50, thereby reducing errors of a converting digital code outputted from an ADC core unit 118.

Following the generation of the base voltage Vbase through a connection between the reference circuit 50 and a ground voltage, the circuit structure and the processing methoth are explained in detail as follows.

With respect to a required ADC input range voltage signal 212, a voltage signal generated by the gain block 208 is added to the base voltage Vbase through an adder 210 to obtain the ADC input range voltage signal 212.

Each of the ADC 200 further includes an offset block 206, which receives a voltage signal outputted from the gain block 208. A voltage signal outputted from the offset block 206 is added to the base voltage Vbase through an adder 204 to obtain an offset voltage signal ADC_VIM. The offset voltage signal ADC_VIM may be regulated by an external regulating capacitor 110, and a voltage value after regulation is represented by Voffset.

The offset voltage signal ADC_VIM is one of input signals of a DC buffer 116.

Each of the ADC 200 further includes a multiplexer (MUX) 214 and a DC buffer 216. The offset voltage signal outputted from the adder 204 and the base voltage Vbase are inputted to the MUX 214. An output from the MUX 214 through the DC buffer 116 outputs a clamp voltage signal Vclamp. The clamp voltage signal Vclamp may be regulated by an external regulating capacitor 122, and is then added with an inputted data signal through a switch 124. The mechanism thereof is as follows.

An input end of each of the ADC 200 may input an analog voltage signal Vin to the internal. When the analog voltage signal Vin is inputted, the switch 124 is controlled to provide a clamp action for adding a DC voltage to each of the inputted analog voltage signal Vin to obtain a data voltage signal ADC_VIP. The DC voltage is a voltage outputted from the DC buffer 116, which also contains variations of the base voltage Vbase.

In each of the ADC 200, the voltage signals of ADC_VIP and ADC_VIM are inputted to the ADC core unit 118 through the DC buffer 116, and different digital code values corresponding to different sizes of Vin are generated through the algorithm thereof.

In the above-mentioned, a circuit block 218 for external connection is a source for sensing external noise. However, the electric potential of the circuit block 218 is the same as that of the signal ADC_VIM. When noise is generated externally by a power supply or a ground voltage or an ADC, the signal ADC_VIP will vary as the signal ADC_VIM.

In addition, the analog voltage signal Vin can be an image signal of RGB, YPbPr, or Composite Video Broadcast Signal (CVBS).

According to an embodiment of the invention, a working voltage and working current generated by the reference circuit 50 will be affected by variations of process, voltage, temperature (P, V, T) or noise. The voltage signals of ADC_VIP and ADC_VIM in the ADC 200 will also vary. The difference between the two is consistent, and will vary as the base voltage Vbase. When noise is generated externally by a power supply or a ground voltage or a circuit, the voltage signal ADC_VIP will vary as the voltage signal ADC_VIM. The digital input range voltage signal will vary also as the base voltage Vbase. Therefore, it is not relatuvely easy for a converting digital code to vary accordingly, and the occurrence of an error may be reduced.

The analog-to-digital converting circuit of the invention makes a plurality of control voltage signals of the ADC core unit 116 all reference the base voltage Vbase generated by the reference circuit, and output a converting digital code, thereby reducing possibility of occurrence of an error or a discrepancy in the outputted code.

With respect to the treatment method of the invention, a reference circuit is used to provide a base voltage, which has one end at a ground voltage. Furthermore, the base voltage is inputted to an ADC, such that a DC buffer and a plurality of control voltage signals of an ADC core unit in the ADC circuit reference the base voltage and then a converting digital code is outputted.

The reference circuit may provide the base voltage signal after passing through a DC buffer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An analog-to-digital converting circuit, including:
    a reference circuit, providing a base voltage, which has one end grounded; and
    an analog-to-digital converter (ADC), which receives an analog input signal and the base voltage, wherein the ADC includes:
        a first DC buffer, which internally receives an offset voltage signal and a data voltage signal to be digitalized, and outputs two converting control signals; and
        an ADC core unit, which receives the two converting control signals from the first DC buffer and an ADC input range voltage signal, and outputs a digital code, wherein the offset voltage signal and the data voltage signal and the ADC input range voltage signal have been added with the base voltage signal.

2. The analog-to-digital converting circuit as claimed in claim 1, wherein the reference circuit first passes through a second DC buffer to provide the base voltage signal.

3. The analog-to-digital converting circuit as claimed in claim 1, wherein the ADC further includes:
    a gain block, which generates a first voltage signal and a second voltage signal;
    an offset block, which receives the first voltage signal;
    a first adder, which receives the base voltage signal and an output from the offset block, and outputs the offset voltage signal, the offset voltage signal being outputted to the first DC buffer after being regulated;

a multiplexer (MUX), which receives the offset voltage signal and the base voltage signal;

a second DC buffer, which receives an output from the MUX, and outputs a clamp voltage, wherein the clamp voltage is added to the inputted analog input signal after being regulated, and generates the data voltage signal to the first DC buffer; and a second adder, which receives the second voltage signal from the gain block and the base voltage signal, and outputs the ADC input range voltage signal to the ADC core unit.

4. The analog-to-digital converting circuit as claimed in claim 3, wherein the reference circuit first passes through a third DC buffer to provide the base voltage signal.

5. The analog-to-digital converting circuit as claimed in claim 3, further including a switch, which is used for adding the regulated clamp voltage to the analog input signal.

6. The analog-to-digital converting circuit as claimed in claim 3, further including an offset regulating capacitor, which connects to one end of the ADC to regulate the offset voltage signal.

7. The analog-to-digital converting circuit as claimed in claim 3, further including a clamp regulating capacitor, which connects to one end of the ADC to regulate the clamp voltage.

* * * * *